US010896376B2

(12) United States Patent
Baughman et al.

(10) Patent No.: US 10,896,376 B2
(45) Date of Patent: *Jan. 19, 2021

(54) COGNITIVE REPLICATION THROUGH AUGMENTED REALITY

(71) Applicant: International Business Machines Corporation, Armonk, NY (US)

(72) Inventors: Aaron K. Baughman, Silver Spring, MD (US); Diwesh Pandey, Bangalore (IN); John P. Perrino, Hedgesville, WV (US); Todd R. Whitman, Bethany, CT (US)

(73) Assignee: International Business Machines Corporation, Armonk, NY (US)

( * ) Notice: Subject to any disclaimer, the term of this patent is extended or adjusted under 35 U.S.C. 154(b) by 415 days.

This patent is subject to a terminal disclaimer.

(21) Appl. No.: 15/846,746

(22) Filed: Dec. 19, 2017

(65) Prior Publication Data

US 2019/0019091 A1    Jan. 17, 2019

Related U.S. Application Data

(63) Continuation of application No. 15/646,508, filed on Jul. 11, 2017.

(51) Int. Cl.
*G06N 5/02* (2006.01)
*G09B 19/00* (2006.01)
(Continued)

(52) U.S. Cl.
CPC ............ *G06N 5/022* (2013.01); *A63F 13/00* (2013.01); *G06F 3/011* (2013.01); *G06F 30/20* (2020.01);
(Continued)

(58) Field of Classification Search
CPC ........ A61B 5/165; A61B 5/486; G06N 5/022; G06F 17/5009
See application file for complete search history.

(56) References Cited

U.S. PATENT DOCUMENTS 7,841,966 B2 * 11/2010 Aaron ................ A63B 24/0062
   482/8
9,248,358 B2   2/2016 Tinjust
(Continued)

FOREIGN PATENT DOCUMENTS

WO    2016154543 A1    9/2016

OTHER PUBLICATIONS

Cheryl Stinson and Doug A. Bowman, "Feasibility of Training Athletes for High-Pressure Situations Using Virtual Reality", Apr. 2014, IEEE Transactions on Visualization and Computer Graphics, vol. 20, No. 4, p. 606-615 (p. 1-10 of attached pdf). (Year: 2014).*
(Continued)

*Primary Examiner* — Kamran Afshar
*Assistant Examiner* — Ying Yu Chen
(74) *Attorney, Agent, or Firm* — Monchai Chuaychoo; Maeve M. Carpenter

(57) ABSTRACT

In one embodiment of the present invention, environment information corresponding to a user is received. A target environment is simulated in augmented reality based on the environment information. Physiological information corresponding to the user is received. A cognitive state of the user is determined based on the physiological information. In response to determining that the cognitive state of the user is not a target cognitive state, the target environment is modified in augmented reality to achieve the target cognitive state.

12 Claims, 3 Drawing Sheets

(51) Int. Cl.
    *G06F 3/01*     (2006.01)
    *G06T 19/00*     (2011.01)
    *G06N 3/00*     (2006.01)
    *A63F 13/00*     (2014.01)
    *G06F 30/20*     (2020.01)
    *G06N 20/00*     (2019.01)

(52) U.S. Cl.
    CPC .............. *G06N 3/006* (2013.01); *G06T 19/00* (2013.01); *G06T 19/006* (2013.01); *G09B 19/00* (2013.01); *G06F 2203/011* (2013.01); *G06N 20/00* (2019.01)

(56) References Cited

U.S. PATENT DOCUMENTS

| | | | |
|---|---|---|---|
| 10,687,756 B1* | 6/2020 | Jacobsen | G16H 40/63 |
| 2004/0131998 A1 | 7/2004 | Marom et al. | |
| 2013/0330693 A1 | 12/2013 | Sada et al. | |
| 2015/0112606 A1* | 4/2015 | He | A61B 5/14542 702/19 |
| 2015/0142313 A1* | 5/2015 | Haberman | G01C 21/3415 701/533 |
| 2016/0030825 A1 | 2/2016 | Mazzanobile et al. | |
| 2016/0314620 A1 | 10/2016 | Reilly et al. | |
| 2017/0215011 A1* | 7/2017 | Goldstein | H04R 25/305 |
| 2018/0279934 A1* | 10/2018 | Wo | A61B 5/162 |
| 2019/0019089 A1 | 1/2019 | Baughman | |

OTHER PUBLICATIONS

Ferran Argelaguet Sanz, Franck Multon, and Anatole Lécuyer, "A methodology for introducing competitive anxiety and pressure in VR sports training", Apr. 8, 2015, Frontiers in Robotics and AI, vol. 2 | Article 10, pp. 1-11. (Year: 2015).*
BM Appendix P, list of patents and patent applications treated as related, filed herewith, 2 pages.
Bondarev,et al., "CARAT: a Toolkit for Design and Performance Analysis of Component-Based Embedded Systems", 2007 Design, Automation & Test in Europe Conference & Exhibition, pp. 1024-1029.
Zhang et al., "Covariance Matrix Tapers Estimation in Knowledge-Aided Stap for Sea Clutter Environment", IET International Radar Conference 2015, 6 pages.
IBM Appendix P, list of patents and patent applications treated as related, filed herewith, 2 pages.
Andersson et al., "Traffic flow in the operating room: An explorative and descriptive study on air quality during orthopedic trauma implant surgery" 2012, American Journal of Infection Control 40 (2012) p. 750-755. (Year 2012).
Backlund et al., "Sidh—a Game Based Firefighter Training Simulation", 2007, 11th International Conference Information Visualization (IV'07), p. 1-9. (Year: 2007).
Cowan et al., "Effects of sound on visual realism perception and task performance", Jul. 20, 2014, Springer, p. 1207-1216. (Year: 2014).
Haynes et al., "Validation of travel times to hospital estimated by GIS", Sep. 19, 2006, International Journal of Health Geographies 2006, 5:40, p. 1-8. (Year: 2006).

\* cited by examiner

COGNITIVE REPLICATION THROUGH AUGMENTED REALITY

BACKGROUND OF THE INVENTION

The present invention relates generally to the field of augmented reality, and more particularly to cognitive replication through augmented reality.

Augmented reality (AR) is a live direct or indirect view of a physical, real-world environment whose elements are augmented (or supplemented) by computer-generated sensory input such as sound, graphics, or GPS information. AR is related to computer-mediated reality, a more general concept in which a view of reality is modified (possibly even diminished rather than augmented) by a computer. AR technology functions by enhancing the current perception of reality for a user.

Through AR technology, information about the surrounding real world environment of a user becomes interactive and digitally manipulable. Information about the virtual environment and its elements is overlaid on the real world. This information can be virtual or real, e.g., seeing other real sensed or measured information such as electromagnetic radio waves overlaid in exact alignment with where they actually are in space. Augmented reality brings out the components of the digital world into a perceived real world of the user.

SUMMARY

In one embodiment of the present invention, environment information corresponding to a user is received. A target environment is simulated in augmented reality based on the environment information. Physiological information corresponding to the user is received. A cognitive state of the user is determined based on the physiological information. In response to determining that the cognitive state of the user is not a target cognitive state, the target environment is modified in augmented reality to achieve the target cognitive state.

DETAILED DESCRIPTION

The present invention will now be described in detail with reference to the Figures. The descriptions of various instances, scenarios, and examples related to the present invention are presented for purposes of illustration and are not intended to be exhaustive or limited to the embodiments disclosed.

Figure 1:
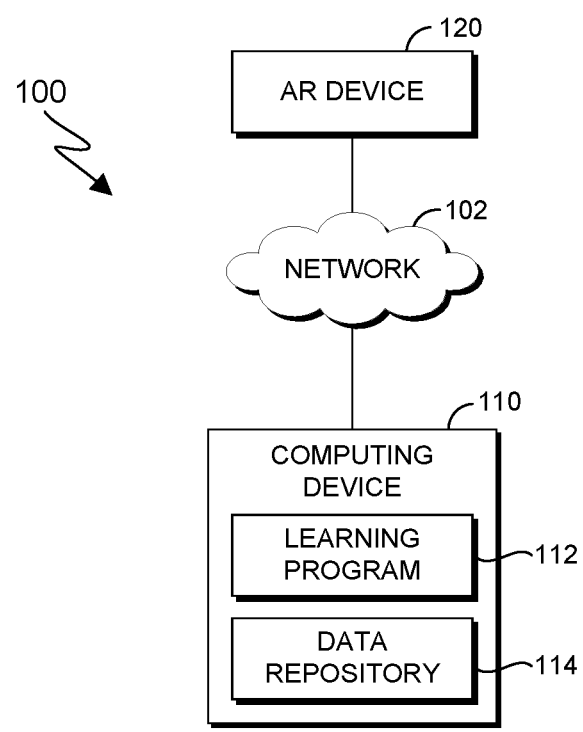
FIG. 1 is a functional block diagram depicting one example of an augmented reality learning environment, in accordance with one or more embodiments disclosed herein.

FIG. 1 is a plan view illustration depicting one example of augmented reality learning environment 100, in accordance with one or more embodiments disclosed herein. FIG. 1 provides only an illustration of one implementation and does not imply any limitations with regard to the environments in which different embodiments may be implemented. Some modifications to the depicted environment may be made by those skilled in the art without departing from the scope of the invention as recited by the claims. As depicted, learning environment 100 includes network 102, computing device 110, learning program 112, data repository 114, and augmented reality (AR) device 120.

In some embodiments, computing device 110 and AR device 120 are interconnected and communicate through network 102. In some embodiments, network 102 is a local area network (LAN), a telecommunications network, a wireless local area network (WLAN), such as an intranet, a wide area network (WAN), such as the Internet, or any combination thereof, and can include wired, wireless, or fiber optic connections. In some embodiments, network 102 can generally be any combination of connections and protocols that will support communications between computing device 110, AR device 120, and any other computing device (not shown) connected to network 102.

In some embodiments, computing device 110 is any electronic device, or combination of electronic devices, capable of executing computer readable program instructions and communicating with any computing device within computing environment 100. For example, computing device 110 may be a workstation, personal computer, laptop computer, tablet, personal digital assistant, or mobile phone. In some embodiments, computing device 110 is a computer system utilizing clustered computers and components (e.g., database server computers, application server computers) that act as a single pool of seamless resources when accessed by elements of computing environment 100. For example, computing device 110 may be a data center in a cloud computing environment. In some embodiments, computing device 110 includes components as depicted and described with respect to computing system 300 in FIG. 3.

In some embodiments, learning program 112 is any computer program, application, subprogram of a larger program, such as an OS, or a combination thereof that determines environmental elements for AR device 120 to provide a user in order to achieve a target cognitive state of the user.

In some embodiments, learning program 112 determines a cognitive state of a user of AR device 120 based on the physiological information collected by AR device 120. A cognitive state, for example, may be any mental state of the user such as stressed or relaxed. Learning program 112 can additionally determine a degree of the cognitive state. For example, learning program 112 may determine that a user is in a high stress state or a low stress state.

As depicted in FIG. 1, learning program 112 is located in computing device 110. In other embodiments, learning program 112 is located in AR device 120 or any other device connected to network 102.

In some embodiments, data repository 114 contains environment information and physiological information collected by AR device 120. In some embodiments, data repository 114 stores the environment information and cognitive information collected by AR device 120.

In some embodiments, data repository 114 can be implemented with a non-volatile storage media known in the art. For example, directory database 114 may be implemented with a tape library, optical library, one or more independent hard disk drives, or multiple hard disk drives in a redundant array of independent disks (RAID). In an embodiment, directory database 114 can be implemented using a suitable storage architecture known in the art. For example, directory database 114 may be implemented as a relational database, an object-oriented database, or an object-relational database.

In some embodiments, AR device 120 is a computing device that provides a view, direct or indirect, of a real-world environment with environmental elements that are computer-generated. In some embodiments, environmental elements include visual and/or audial elements. In some embodiments, AR device 120 can be a wearable device or a hand-held device.

In some embodiments, AR device 120 includes one or more sensors that collecting environment information and physiological information. Environment information may include, for example, social interactions of a user of AR device 120, traffic information (e.g., traffic density during a commute of the user, a commute time of the user), weather at the location of the user, and any elements that cause stress for the user. Physiological information may include brain wave information of a user of AR device 120, heart rate of the user, breathing rate of the user, internal body temperature of the user, and blood pressure of the user. In some embodiments, AR device 120 includes components as depicted and described with respect to computing system 300.

Figure 2:
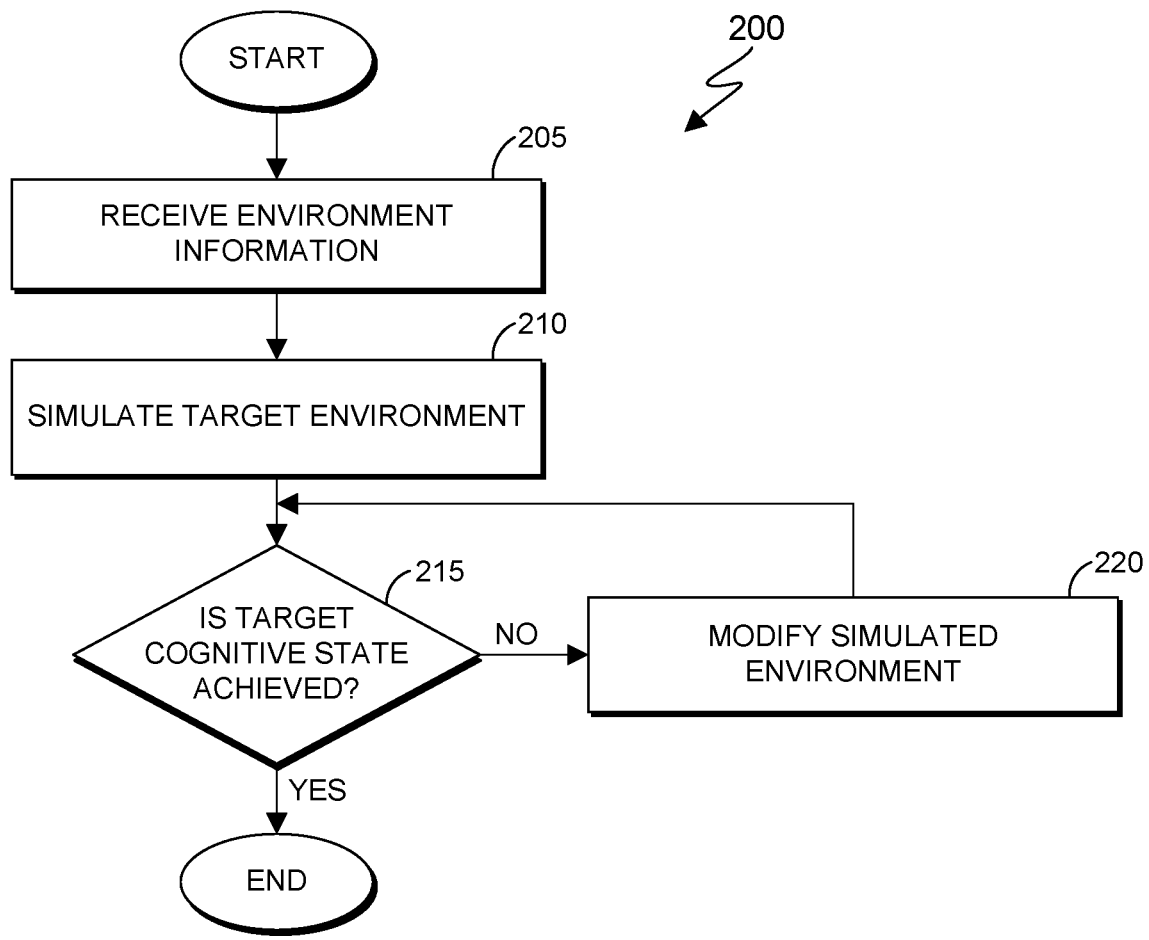
FIG. 2 a flowchart depicting one example of a method for cognitive alteration through augment reality, in accordance with one or more embodiments disclosed herein.

FIG. 2 is a flowchart of method 200 depicting one example of operational steps for cognitive alteration through augment reality, in accordance with one or more embodiments disclosed herein. In some embodiments, workflow 200 is performed by learning program 112. In other embodiments, workflow 200 is performed by any other computer program while working with learning program 112. In some embodiments, learning program 112 begins performing workflow 200 in response to receiving an indication by a user of AR device 120 or any other computing device connected to network 102.

Learning program 112 receives (205) target environment information. A target environment may be a setting to be simulated by AR device 120 for a user. In some embodiments, the target environment is a vocational setting of the user. For example, in an instance where the user is an athlete, the target environment may be a corresponding athletic competition. As another example, in an instance where the user is a surgeon, the target environment may be an operating room.

In some embodiments, learning program 112 receives target environment information from AR device 120. AR device 120 may collect the target environment information through one or more sensors. In some embodiments, target environment information is any objects or sounds related to the target environment. Target environment information may include social interactions of a user of AR device 120, traffic information (e.g., traffic density during a commute of the user, a commute time of the user), weather at the location of the user, and any elements that cause stress for the user. In some embodiments, target environment information is stored in data repository 114.

An as example, a user may be a golfer, and the target environment may be a golf tournament. Learning program 112 may collect target environment information throughout the day of the golf tournament. For example, target environment information collected may include social interactions between the user and others prior to the golf tournament (e.g., a motivational speech from a friend, instruction from a coach, etc.) as well as social interactions during the tournament (e.g., a loud cheer from a fan during a backswing of the user, taunts from opponents while putting, etc.). Learning program 112 may further collect information related to weather conditions (e.g., foggy and cold weather, time of sunset, etc.) and the natural environment (e.g., a flock of geese flying over the course, etc.) during the golf tournament. Learning program 112 may similarly collect target environment information from multiple golf tournaments played by the user and store the collected information in data repository 114.

Learning program 112 simulates (210) the target environment. In some embodiments, learning program 112 simulates, in augmented reality (AR), the target environment based on the target environment information collected and stored. Learning program 112 may determine which target environment information has been collected repeatedly, or most often, and simulate those elements in AR through AR device 120.

Continuing the golf example, learning program 112 may determine that the user often receives instruction from a coach immediately prior to taking the first swing at each hole and that a fan often holds up a large yellow sign in front of the user throughout the course of play. During a practice session of golf while the user is using AR device 120, learning program 112 may then simulate, through AR device 120, the instruction from the coach as an audial element and the sign from the fan as a visual element at their appropriate times while the user is playing the practice session.

Learning program 112 determines (215) if a target cognitive state is achieved. In some embodiments, learning program 112 determines the cognitive state of a user and compares the determined cognitive state against the target cognitive state. The cognitive state of the user may be any mental state such as stressed, relaxed, excited, or angry. Further, the cognitive state may be a degree of a mental state such as a high stress state or a low stress state. As an example, in an instance where learning program 112 determines that the cognitive state of a user is a relaxed state, and the target cognitive state is a stressed state, learning program 112 determines that target cognitive state is not achieved.

In some embodiments, learning program 112 determines the cognitive state of the user based on biometric information corresponding to the user. Biometric information may include, for example, physiological measurements such as brain wave information, heart rate, respiratory rate, internal body temperature, and blood pressure. In some embodiments, AR device 120 receives the biometric information corresponding to the user of AR device 120 through one or more sensors.

If the determined cognitive state matches the target cognitive state (decision block 215, YES branch), learning program 112 maintains the simulated environment.

If the determined cognitive state does not match the target cognitive state (decision block 215, NO branch), learning program 112 modifies (220) the simulated environment (i.e., the augmented reality environment) in order to achieve the target cognitive state. For example, in an instance where learning program 112 determines that the cognitive state of a user is a relaxed state, and the target cognitive state is a stressed state, learning program 112 modifies the simulated environment in a manner that increases the stress of the user.

Continuing the golf example, the cognitive state of the user may be monitored throughout the practice session of golf. The target cognitive state of the user may be a high stress state. During the first two holes of the practice session, the cognitive state of the user is determined to be a high stress state. Therefore, the target cognitive state is achieved and the simulated environment and elements are maintained, unchanged, during that time. However, while the user is putting on the third hole during the practice session, the cognitive state of the user is determined to be relaxed, despite, e.g., the presence of the simulated fan holding a large yellow sign prior to, and during, the putt. Therefore, the target cognitive state is not achieved at that instance, and the simulated environment will be modified in order to achieve the high stress target cognitive state while the user is putting.

In some embodiments, learning program 112 modifies various elements of the AR simulated environment such as visual elements (i.e., objects) and audial elements (i.e., sounds). Simulated sounds may be binaural, i.e., relating to both ears of a user. Modifications may include, for example, increasing the size or quantity of a currently simulated element. Modifications may further include adding a new visual or audial element or removing a currently simulated element. In instances where the target environment is an athletic competition, simulated objects may include, for example, fan avatars, signs, and opposing player avatars. Simulated sounds may include, for example, crowd noise, white noise, shouts from fans, taunts from opposing players, and impaired (e.g., lower in loudness, fewer in number) communications from teammates.

Continuing the golf example, to increase the stress of the user while putting, learning program 112 determines, based on the target environment information stored in data repository 114, that a flock of geese occasionally flies over the golf course while the user is putting and that a fan often shouts the name of the user throughout the course of play. These visual and audial elements are therefore simulated during putts in order to increase the stress of the user.

In some embodiments, the simulated environment is modified based on successful modifications previously made for that user or other users. A successful modification may be a modification that caused the cognitive state of a user to be closer to the target cognitive state. Learning program 112 may determine if there is such success information for similar users stored in data repository 114. A similar user may be, for example, a user with a target environment or target cognitive state similar to that of the current user. If there is a similar user, augmented reality elements of the simulated environment may be modified similarly to the previous user.

In some embodiments, learning program 112 monitors a task performance of a user while monitoring the cognitive state of the user. Further, learning program 112 may determine whether the task performance while the user is in the cognitive state as compared with the task performance while the user is not in the cognitive state. A task may be, for example, an athletic competition where the user is an athlete or a vocational duty of the user such as putting out a fire where the user is a firefighter.

Continuing the golf example, learning program 112 may monitor how well the user plays throughout the course of the practice session of golf while the user is in a high stress state and while the user is not in a high stress state.

Figure 3:
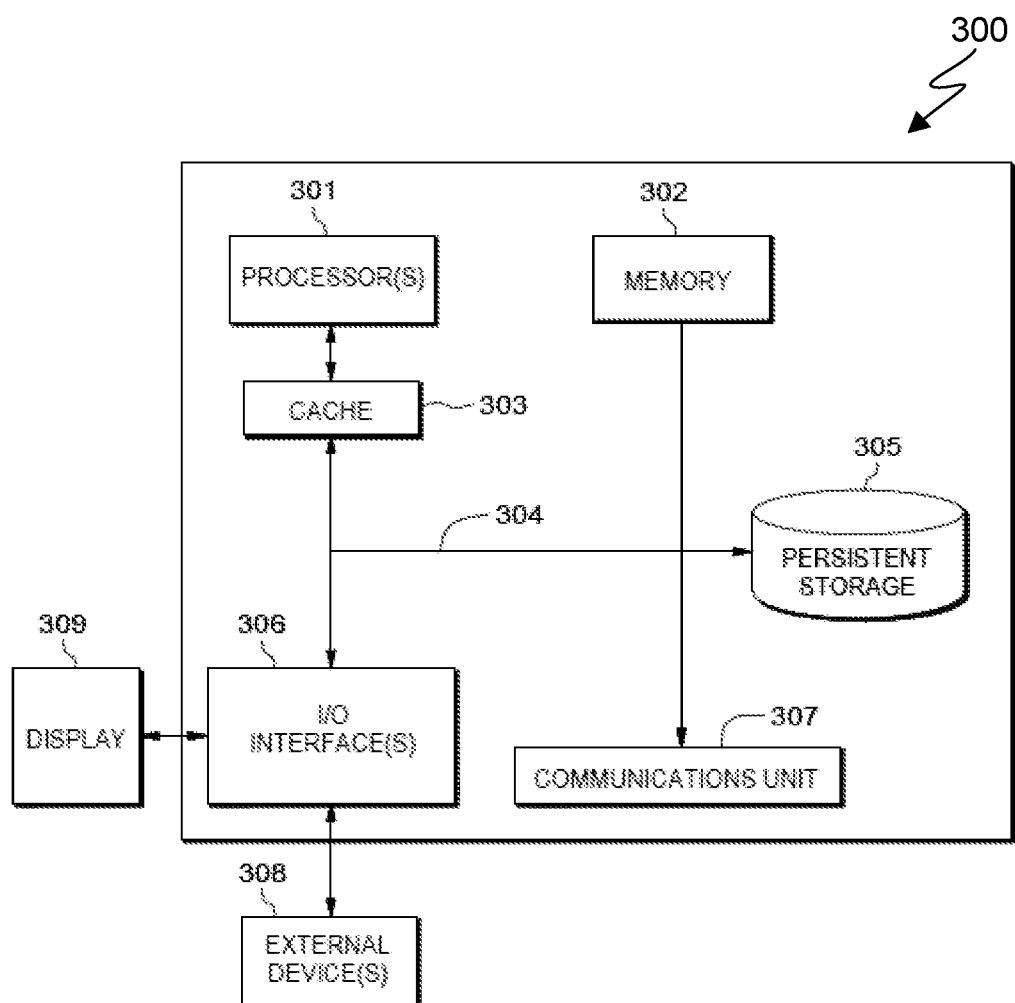
FIG. 3 is a block diagram of components of a computing system, in accordance with one or more embodiments disclosed herein.

FIG. 3 depicts computing system 300, which illustrates components of computing device 110 and client device 120. Computing system 300 includes processor(s) 301, cache 303, memory 302, persistent storage 305, communications unit 307, I/O interface(s) 306, and communications fabric 304.

Communications fabric 304 provides communications between cache 303, memory 302, persistent storage 305, communications unit 307, and I/O interface(s) 306. Communications fabric 304 can be implemented with any architecture designed for passing data and/or control information between processors (e.g., microprocessors, communications and network processors, etc.), system memory, peripheral devices, and any other hardware components within a system. For example, communications fabric 304 may be implemented with one or more buses or a crossbar switch.

Memory 302 and persistent storage 305 are computer readable storage media. In some embodiments, memory 302 includes random access memory (RAM) (not shown). In general, memory 302 may include any suitable volatile or non-volatile computer readable storage media. Cache 303 is a fast memory that enhances the performance of processors 301 by holding recently accessed data, and data near recently accessed data, from memory 302.

Program instructions and data used to practice embodiments of the present invention may be stored in persistent storage 305 and in memory 302 for execution by one or more of the respective processors 301 via cache 303. In some embodiments, persistent storage 305 includes a magnetic hard disk drive. Alternatively, or in addition to a magnetic hard disk drive, persistent storage 305 may include a solid state hard drive, a semiconductor storage device, read-only memory (ROM), erasable programmable read-only memory (EPROM), flash memory, or any other computer readable storage media that is capable of storing program instructions or digital information.

The media used by persistent storage 305 may also be removable. For example, a removable hard drive may be used for persistent storage 305. Other examples include optical and magnetic disks, thumb drives, and smart cards that are inserted into a drive for transfer onto another computer readable storage medium that is also part of persistent storage 305.

Communications unit 307, in these examples, provides for communications with other data processing systems or devices. In these examples, communications unit 307 includes one or more network interface cards. Communications unit 307 may provide communications through the use of either or both physical and wireless communications links. Program instructions and data used to practice embodiments of the present invention may be downloaded to persistent storage 305 through communications unit 307.

I/O interface(s) 306 allows for input and output of data with other devices that may be connected to each computer system. For example, I/O interface 306 may provide a connection to external devices 308 such as a keyboard, keypad, a touch screen, and/or some other suitable input device. External devices 308 can also include portable computer readable storage media such as, for example, thumb drives, portable optical or magnetic disks, and memory cards. Software and data used to practice embodiments of the present invention can be stored on such portable computer readable storage media and can be loaded onto persistent storage 305 through I/O interface(s) 306. I/O interface(s) 306 also connect to display 309.

Display 309 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational blocks to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

Embodiments of the present invention may also be delivered as part of a service engagement with a client corporation, nonprofit organization, government entity, internal organizational structure, or the like. These embodiments may include configuring a computer system to perform, and deploying software, hardware, and web services that implement, some or all of the methods described herein. These embodiments may also include analyzing the client's operations, creating recommendations responsive to the analysis, building systems that implement portions of the recommendations, integrating the systems into existing processes and infrastructure, metering use of the systems, allocating expenses to users of the systems, and billing for use of the systems.

What is claimed is:

1. A method comprising:
   monitoring an athlete user while the user is in a target environment;
   gathering environment information experienced by the athlete user while the athlete user is in the target environment;
   simulating, in augmented reality, the target environment by simulating a subset of the gathered environment information;
   receiving physiological information corresponding to the athlete user;
   determining a cognitive state of the athlete user based on the physiological information; and
   responsive to determining that the cognitive state of the athlete user is not a target cognitive state, modifying, in augmented reality via an augmented reality device, the simulated target environment to achieve the target cognitive state by simulating an increase in commute time to a competition setting and an increase in traffic density during a commute of the athletic user to the athletic competition setting.

2. The method of claim 1, wherein the target environment corresponds to a vocation.

3. The method of claim 1, wherein the target environment corresponds to an athletic competition.

4. The method of claim 3, wherein the environment information comprises information selected from the group consisting of: weather at the athletic competition setting.

5. The method of claim 1, wherein modifying the target environment comprises: simulating, in augmented reality, objects or binaural sounds in the target environment.

6. The method of claim 5, wherein objects include fan avatars or opponent avatars, and wherein sounds include crowd noise or opponent taunts.

7. The method of claim 1, wherein the target cognitive state is stress.

8. The method of claim 1, further comprising: responsive to determining that the cognitive state of the user is the target cognitive state, evaluating a user performance while the user is in the target cognitive state.

9. The method of claim 1, wherein the physiological information comprises information selected from the group consisting of: brain wave information, heart rate, breath rate, internal body temperature, and blood pressure.

10. The method of claim 1, further comprising: responsive to determining that the modification achieves the target cognitive state, storing the modification as an indicator of the cognitive state for the user.

11. The method of claim 1, wherein:
    the simulating a subset of the environment information includes simulating a first element.

12. The method of claim 1, wherein simulating the target environment includes simulating, in augmented reality, objects or binaural sounds in the target environment.

* * * * *